United States Patent [19]
Matsuoka

[11] Patent Number: 5,839,918
[45] Date of Patent: Nov. 24, 1998

[54] IC CARRIER

[75] Inventor: Noriyuki Matsuoka, Yokohama, Japan

[73] Assignee: Yamaichi Electronics Co., Ltd., Tokyo, Japan

[21] Appl. No.: 692,067

[22] Filed: Aug. 7, 1996

[30] Foreign Application Priority Data

Aug. 23, 1995 [JP] Japan .................................. 7-237634

[51] Int. Cl.⁶ .............................................. H01R 9/09
[52] U.S. Cl. ................................... 439/526; 206/724
[58] Field of Search ........................ 439/71, 525, 526; 206/724

[56] References Cited

U.S. PATENT DOCUMENTS 4,699,593  10/1987  Grabbe et al. .......................... 439/66
5,009,608  4/1991  Slipe ...................................... 439/331

FOREIGN PATENT DOCUMENTS 7-50762  5/1995  Japan .

*Primary Examiner*—Neil Abrams
*Assistant Examiner*—Barry M. L. Standig
*Attorney, Agent, or Firm*—Wenderoth, Lind & Ponack

[57] ABSTRACT

An IC carrier retains an IC and a wiring sheet in an opposed relation so that electrical connection can be achieved between the IC and a socket through the wiring sheet. The IC carrier comprises a slip-preventive sheet capable of suppressing lateral displacement of the wiring sheet with respect to the IC by exerting a surface pressure against the wiring sheet.

4 Claims, 7 Drawing Sheets

// IC CARRIER

BACKGROUND OF THE INVENTION

1. Field of the Invention

This invention relates to an IC carrier for retaining an IC and a wiring sheet in an opposed relation, so that electrical connection is achieved between the IC and an IC socket through a wiring sheet when the IC carrier is loaded on the IC socket.

2. Brief Description of the Prior Art

Japanese Patent Publication No. 50762/1995 discloses an IC carrier of the type in which the wiring sheet and an IC are retained in an opposed relation between a base plate and a cover plate.

This IC carrier is designed to be loaded on an IC socket so that the IC may contact the socket through the wiring sheet. In this IC carrier, since the wiring sheet serves as an intermediate means for connecting an IC with a socket, the IC having contact pieces arranged at very small pitch intervals can be contacted with the socket having contact members arranged at comparatively large pitch intervals.

It is indispensable for the IC carrier that the wiring sheet and the IC are retained in a correct corresponding relation, that is, retained on the carrier such that the IC and the wiring sheet are that the contact pad of the lead pattern applied to the wiring sheet and the contact pieces of the IC are in correct corresponding relation. If this condition is not satisfied, an appropriate electrical connection between the contact pieces of the IC and the contact members of the socket cannot be achieved when the IC carrier assembly is loaded on the socket. Therefore, how to fulfill this requirement is a problem to be solved.

The present invention has been accomplished in view of the above problem inherent in the prior art.

SUMMARY OF THE INVENTION

It is, therefore, an object of the present invention to provide an IC socket which is capable of fulfilling the above-mentioned requirement.

In order to achieve the above object, there is essentially provided an IC carrier for retaining an IC and a wiring sheet in an opposed relation so that electrical connection is achieved between the IC and a socket through the wiring sheet, the IC carrier comprising a slip-preventive sheet capable of suppressing a lateral displacement of the wiring sheet with respect to the IC by exerting a surface pressure to the wiring sheet.

It is preferred that an IC carrier comprises a base plate and a cover plate, the IC and wiring sheet are retained in an opposed relation between the base plate and the cover plate, and the slip-preventive sheet is integrally bonded to one of the cover plate and the base plate.

It is also preferred that an IC carrier comprises a base plate and a cover plate, the slip-preventive sheet is integrally bonded to the wiring sheet, and the slip-preventive sheet is interposed between a selected one of the cover plate or base plate and the wiring sheet.

It is also preferred that an IC carrier comprises a base plate and a cover plate, the IC is retained on the base plate, the wiring sheet is sandwiched and held between the base plate and the cover plate, and the slip-preventive sheet is interposed between a selected one of the base plate or cover plate and the slip-preventive sheet.

The invention will be better understood and further objects and advantages thereof will become more apparent from the following detailed description of a preferred embodiment taken in conjunction with the drawings.

DETAILED DESCRIPTION OF THE PREFERRED EMBODIMENT

Figure 5:
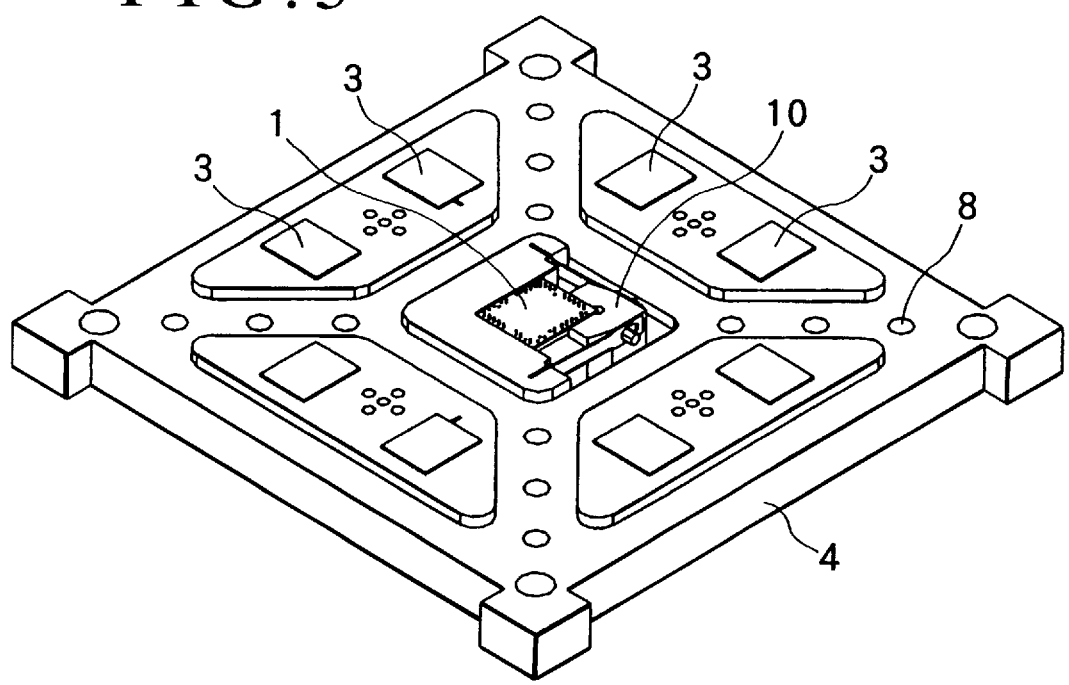
FIG. 5 is a perspective view of a base plate according to a second embodiment of the present invention.
Figure 6:
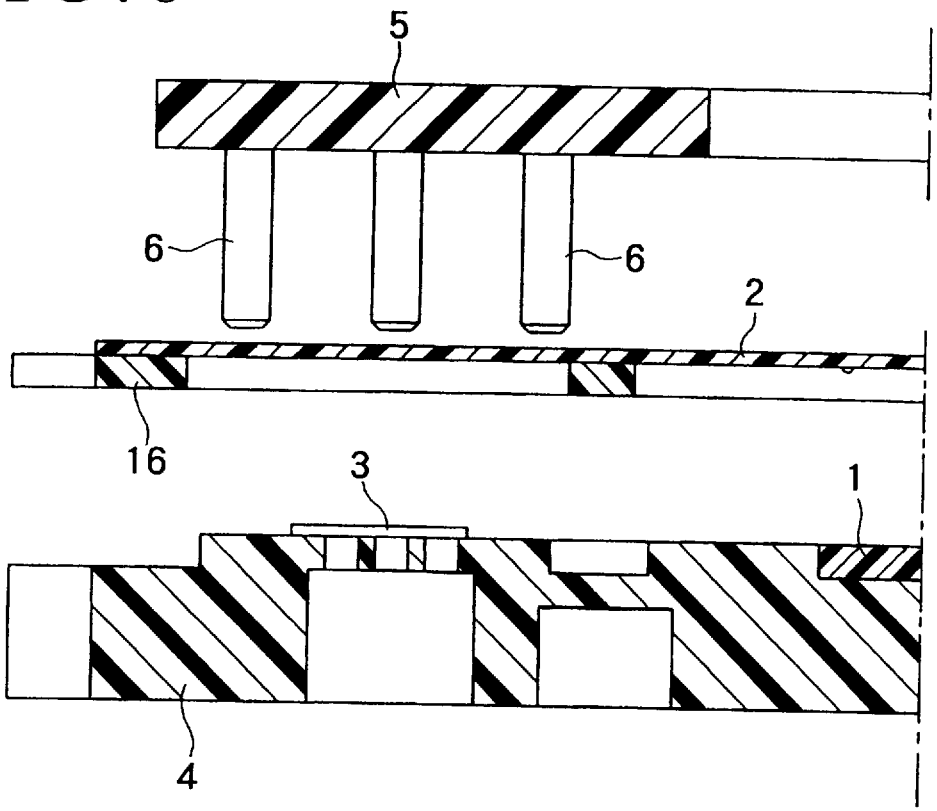
FIG. 6 is an exploded sectional view of a carrier assembly in the second embodiment of the present invention.
Figure 7:
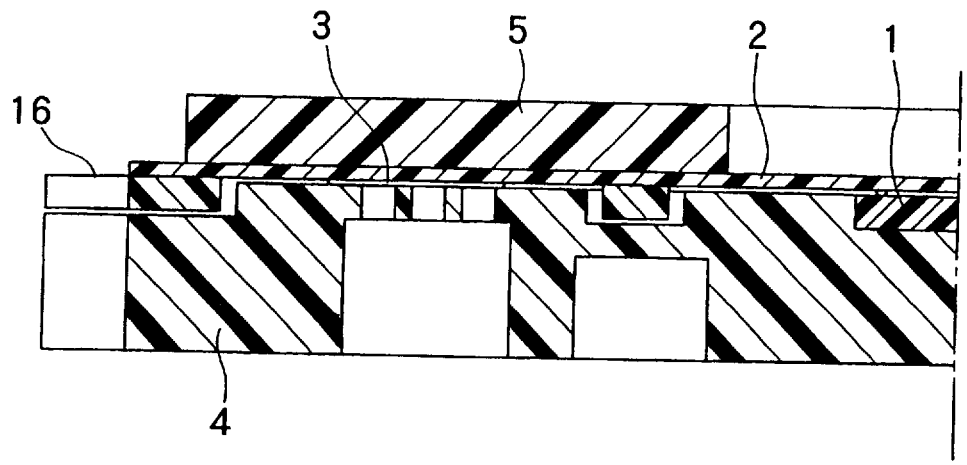
FIG. 7 is a sectional view of the carrier assembly of the second embodiment of the present invention.
Figure 8:
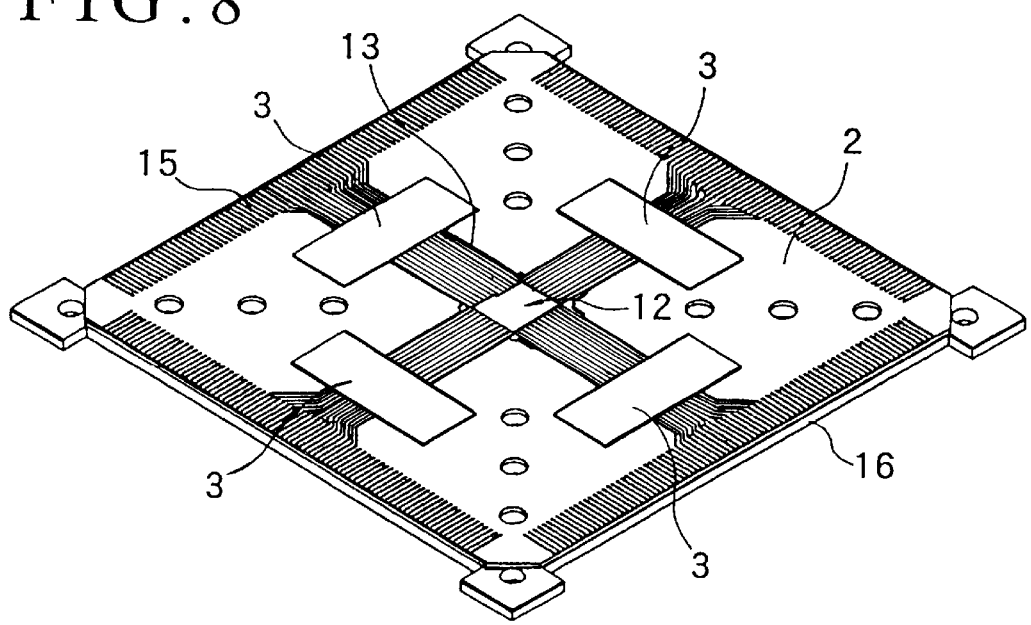
FIG. 8 is a perspective view of a wiring sheet according to a third embodiment of the present invention.
Figure 9:
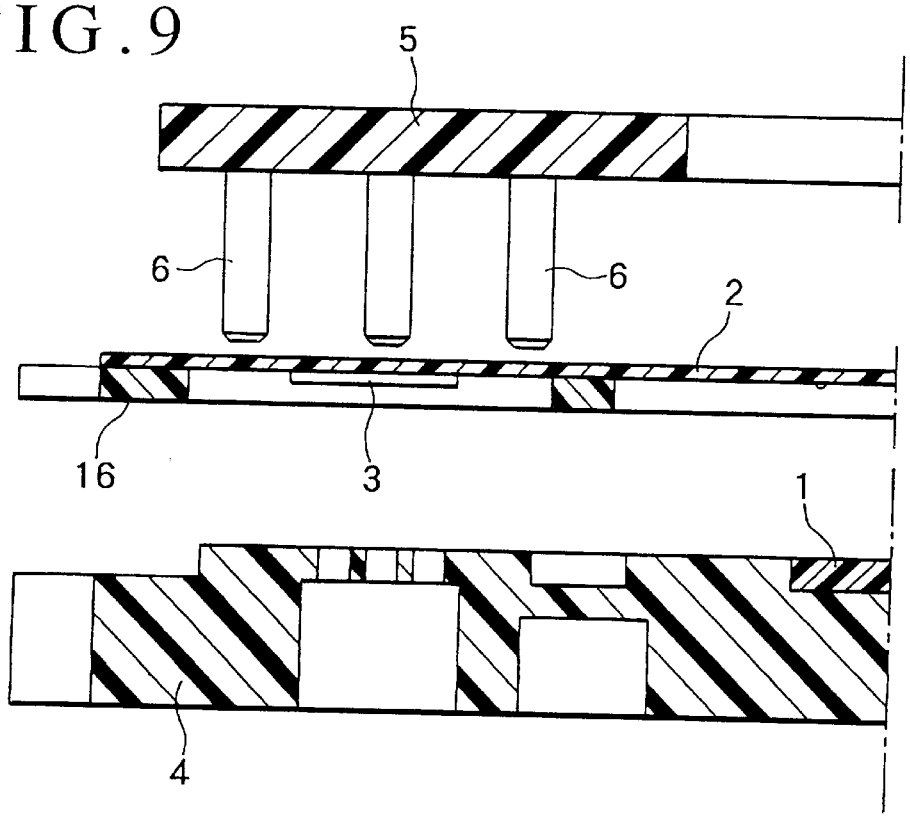
FIG. 9 is an exploded sectional view of a carrier assembly in the third embodiment of the present invention.
Figure 10:
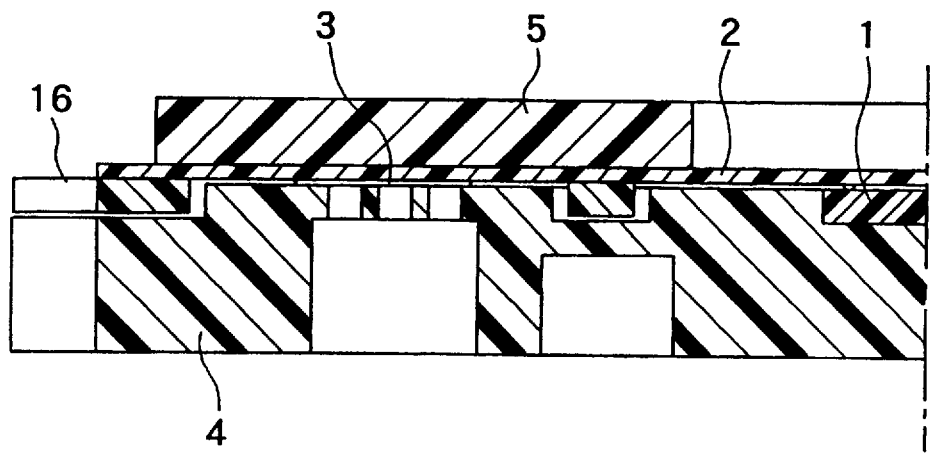
FIG. 10 is a sectional view of the carrier assembly in the third embodiment of the present invention.

Several preferred embodiments of an IC carrier according to the present invention will now be described with reference to FIGS. 1 through 13 of the accompanying drawings. FIGS. 1 through 4 show the first embodiment; FIGS. 5 through 7, the second embodiment; FIGS. 8 through 10, the third embodiment; and FIGS. 11 through 13, the fourth embodiment.

In the above embodiments, the IC carrier retains an IC 1 and a wiring sheet 2 in an opposed relation. The IC carrier has a slip-preventive 3 made of a rubber sheet such as silicon rubber. The slip-preventive sheet 3 is arranged such that a surface pressure is applied to the wiring sheet 2. A urethane sheet may also be used. Each of them has a compressive resiliency.

In the above embodiments, the wiring sheet 2 is made of an insulative film having flexibility such as a synthetic resin film or the like. The wiring sheet 2 has an IC superimposing space 12 at its central portion. The wiring sheet 2 also has a lead pattern 13 intimately arranged on its surface in parallel relation and extends from its four sides towards the four sides of the wiring sheet 2. The wiring sheet 2 is provided at an inner end of the lead pattern 13 with an IC contact pad 14 arranged along the four sides of the IC superimposing space 12 and at an outer end thereof with a socket contact pad 15 arranged along the four sides of the wiring sheet 2.

A backup frame 16 having a comparatively high rigidity and a bending resiliency is bonded to the flexible wiring sheet 2 through an adhesive agent, so that rigidity is applied to the wiring sheet 2 for maintaining its flatness.

A window 18 (see FIG. 3) for receiving therein the IC 1 retained on the base plate 4 is formed in a central portion of the backup frame 16. The IC 1 is received in this window 18 so as to be superimposed on the wiring sheet 2.

Figure 1:
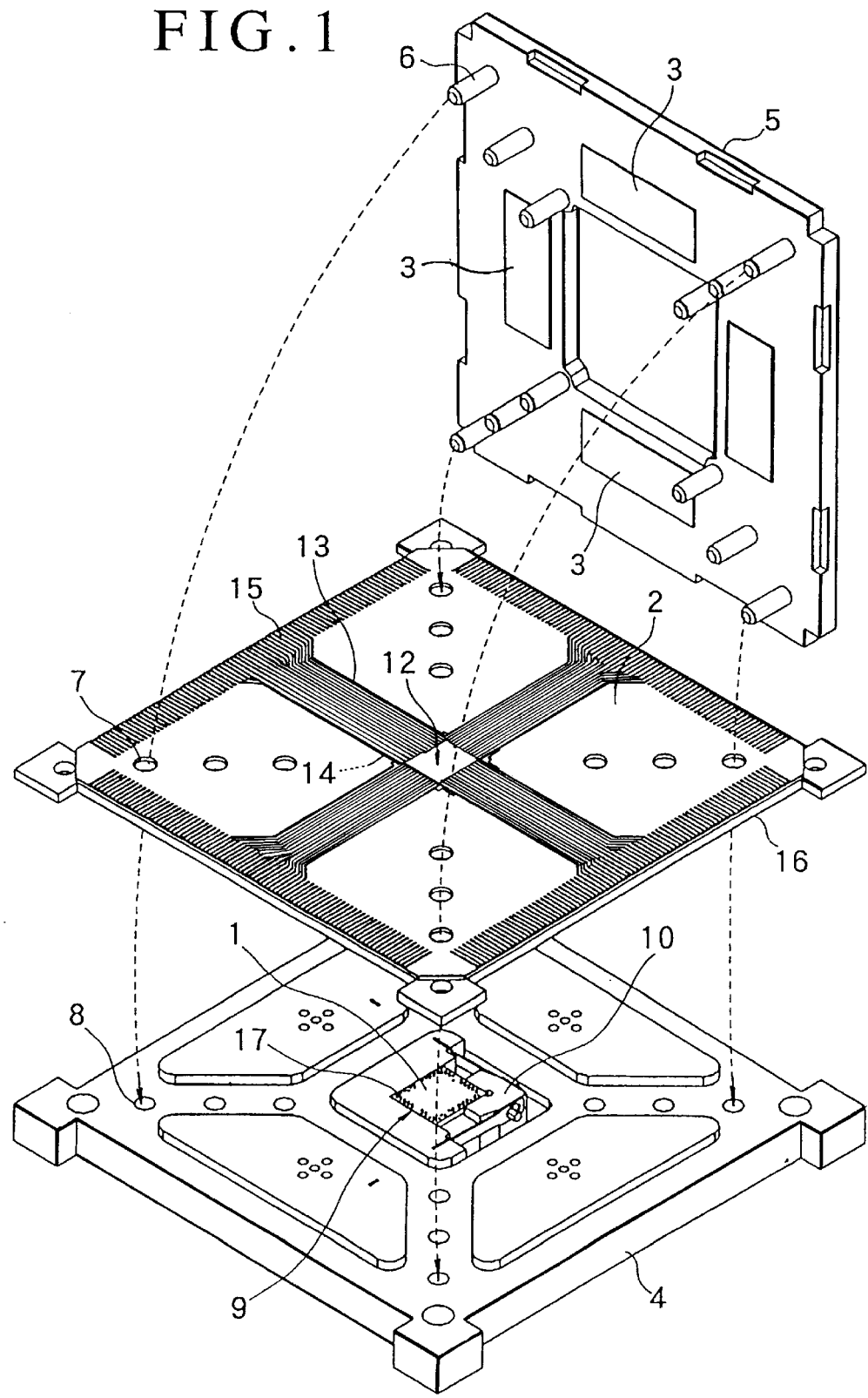
FIG. 1 is an exploded perspective view of a carrier assembly according to a first embodiment of the present invention.

As typically shown in FIG. 1, a suitable example of the IC carrier comprises a square base plate 4 made of an insulative material and a cover plate 5 likewise made of an insulative material. The IC 1 and the wiring sheet 2 are retained in an opposed relation between the base plate 4 and the cover plate 5.

In the first embodiment as shown in FIGS. 1 through 4, the slip-preventive sheet 3 is bonded to the cover plate 5 through an adhesive agent, whereas in the second embodiment as shown in FIGS. 5 through 7, the slip-preventive sheet 3 is bonded to the base plate 4 through an adhesive agent.

Figure 4:
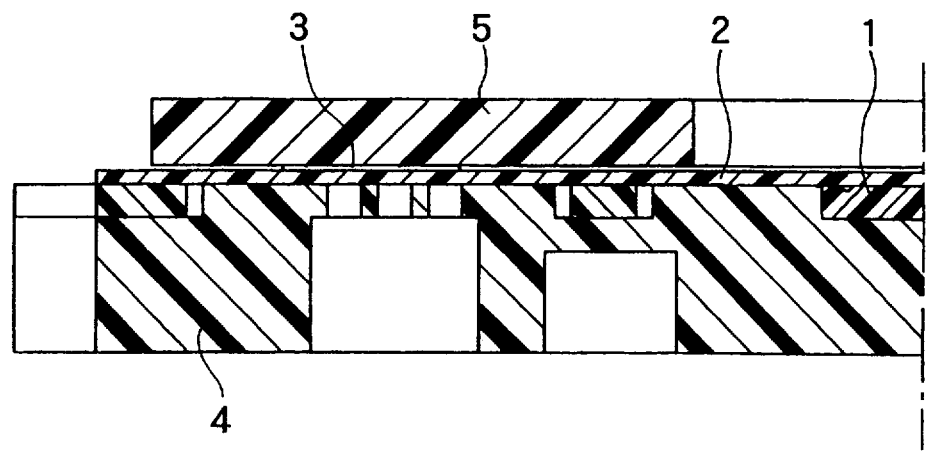
FIG. 4 is a sectional view of the carrier assembly.

As shown in FIGS. 4 and 7, the slip-preventive sheet 3 is bonded to one of the cover plate 5 and the base plate 4 and interposed between the wiring sheet 2 and the selected cover plate 5 or base plate 4 in that state. As a consequence, a surface pressure is applied to the surface of the wiring sheet 2 so that the wiring sheet 2 will not slip laterally. As shown in FIGS. 1 and 5, the slip-preventive sheet 3 is bonded to an inner surface (superimposing surface) of the cover plate 5 or base plate 4.

As one example, a single slip-preventive sheet 3 or a plurality of slip-preventive sheets 3 are bonded to the surface of the cover plate 5 or base plate 4 in such a manner as to surround the arrangement area of the IC 1, so that a surface pressure is applied to the surface of the wiring sheet 2 at an area surrounding the IC superimposing space 12 formed in the central portion of the wiring sheet 2.

For example, four of the slip-preventive sheets 3 can be bonded to the arrangement area of the IC 1 or two of the slip-preventive sheets 3, although not shown, can be bonded to opposing two sides of the arrangement area of the IC 1.

As shown in FIGS. 4 and 7, the slip-preventive sheet 3 bonded to the cover plate 5 is interposed between the cover plate 5 and the wiring sheet 2, whereas the slip-preventive sheet 3 bonded to the base plate 4 is interposed between the base plate 4 and the wiring sheet 2, so that a surface pressure is applied to the wiring sheet 2.

Figure 11:
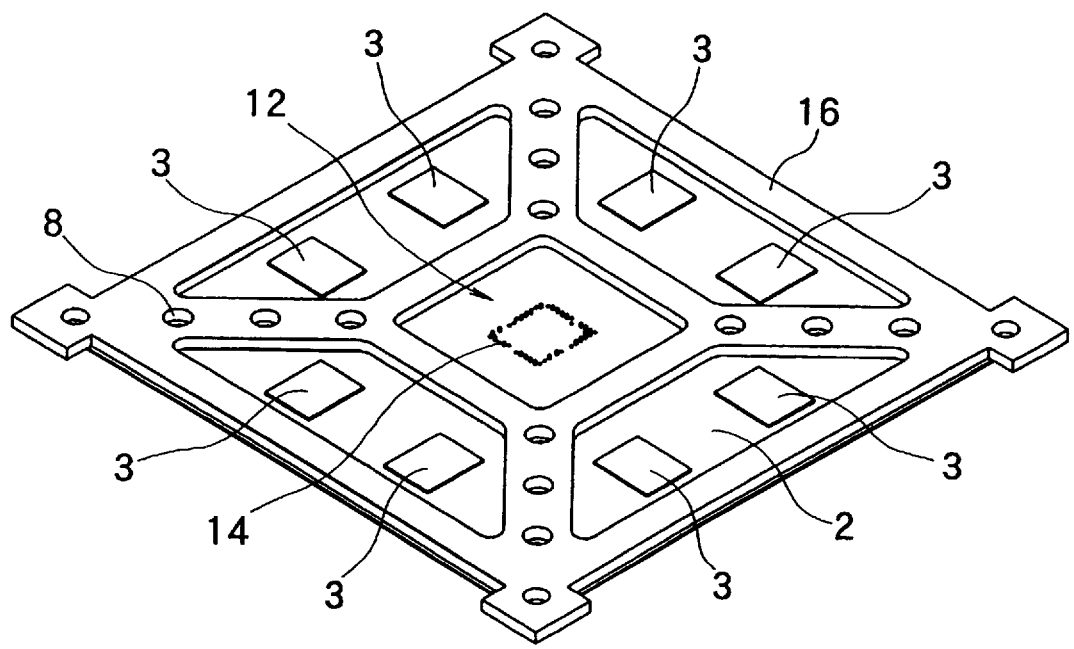
FIG. 11 is a perspective view of a wiring sheet according to a fourth embodiment of the present invention.
Figure 12:
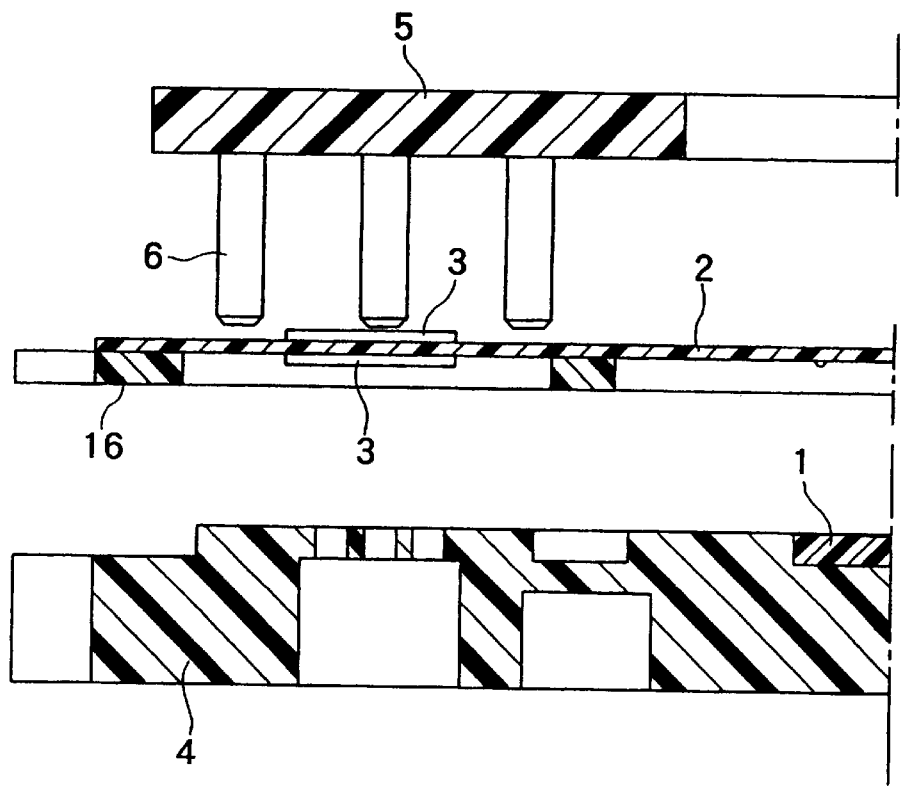
FIG. 12 is an exploded sectional view of a carrier assembly in the fourth embodiment of the present invention.
Figure 13:
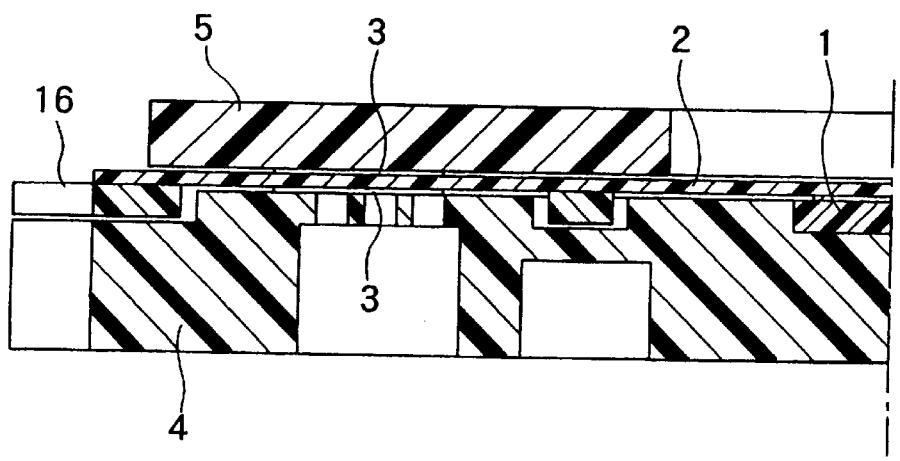
FIG. 13 is a sectional view of the carrier assembly in the fourth embodiment of the present invention.

In the third embodiment as shown in FIGS. 8 through 10 and in the fourth embodiment as shown in FIGS. 11 through 13, the slip-preventive sheet 3 is bonded to the wiring sheet 2.

In the third embodiment, a single slip-preventive sheet 3 or a plurality of slip-preventive sheets 3 are bonded to that surface of the wiring sheet 2 to which the lead pattern 13 is applied. For example, the slip-preventive sheet 3 or plurality of slip-preventive sheets 3 are bonded to the wiring sheet 2 in such a manner as to traverse the surface of the lead pattern 13, so that a slip-preventive function can be exhibited while protecting the lead pattern 13. The slip-preventive sheets 3 are bonded to the peripheral region of the arrangement area of the IC 1, namely the four sides or two sides of the peripheral region of the IC superimposing space 12 as in the previous case.

When the lead pattern 13 is arranged on the wiring sheet 2 opposite the base plate 4, the slip-preventive sheet 3 is interposed between the base plate 4 and the wiring sheet 2. Although not shown, when the lead pattern 13 is arranged on the surface of the wiring sheet 2 opposing the cover plate 5, the slip-preventive sheet 3 is interposed between the cover plate 5 and the wiring sheet 2.

In any case, the slip-preventive sheet 3 bonded to the wiring sheet 2 is pressed against the surface of the base plate 4 or cover plate 5, and is pressed against the surface of the wiring sheet 2 as a reaction thereof.

In the fourth embodiment as shown in FIGS. 11 through 13, the single slip-preventive sheet 3 or plurality of slip-preventive sheets 3 are bonded to the surface opposite to the surface of the wiring sheet 2 to which the lead pattern 13 is applied. In the fourth embodiment, the slip-preventive sheet 3 is arranged on the contact side of the IC 1 and wiring sheet 2.

When the lead pattern 13 is arranged on the surface opposite to the cover plate 5, the slip-preventive sheet 3 is interposed between the base plate 4 and the wiring sheet 2. Although not shown, when the slip-preventive sheet 3 is arranged on the surface opposite to the base plate 4, the slip-preventive sheet 3 is interposed between the cover plate 5 and the wiring sheet 2.

In any case, the slip-preventive sheet 3 bonded to the wiring sheet 2 is, as shown in FIG. 13, pressed against the surface of the base plate 4 or cover plate 5, and as a reaction thereof, a surface pressure is applied the surface of the wiring sheet 2 to prevent the wiring sheet 2 from slipping laterally.

FIGS. 11 through 13 also show an embodiment, in which the slip-preventive sheets 3 are bonded to that surface of the wiring sheet 2 opposing the base plate 4 and that surface of the wiring sheet 2 opposing to the cover plate 5.

As shown in FIG. 13, the slip-preventive sheet 3 bonded to one surface of the wiring sheet 2 is interposed between the base plate 4 and the wiring sheet 2, whereas the slip-preventive sheet 3 bonded to the other surface is interposed between the cover plate 5 and the wiring sheet 2, so that the wiring sheet 2 is prevented from slipping laterally by sandwiching the wiring sheet 2 between the upper and lower slip-preventive sheets 3.

In the above embodiments, as typically shown in FIG. 1, the IC 1 is retained on the base plate 4 and sandwiched between the base plate 4 and the cover plate 5. This sandwiched state can be maintained by connecting the plates 4 and 5 together.

The corresponding relation between the wiring sheet 2 and the IC 1 is maintained in its favorable condition by bringing the slip-preventive sheet 3 into surface-contact with the wiring sheet 2 while sandwiching the wiring sheet 2 between the upper and lower plates 4 and 5.

As means for connecting the cover plate 5 with the base plate 4, for example, that surface area of the cover plate 5 which superimpose with the wiring sheet 2 is provided with a plurality of connecting pins 6 projecting therefrom and those pins 6 are press fitted into connecting holes 8 formed in the base plate 4 via through-holes 7 formed in the wiring sheet 2.

Preferably, the connecting pins 6, the connecting holes 8 and the through-holes 7 are arranged on the diagonal lines of the wiring sheet 2. These diagonal line areas are areas where the connecting pins 6 can effectively be prevented from interfering with the lead pattern 13. Both the plates 4 and 5 are detachably connected together by press-fitting the connecting pins 6 into the corresponding connecting holes 8. By this connection, the wiring sheet 2 is firmly sandwiched and held between the plates 4 and 5.

On the other hand, as the means for retaining the IC 1, for example, the base plate 4 is provided at its central portion with the IC receiving portion 9, and with a holder 10 for holding the IC 1 placed in the IC receiving portion 9. The holder 10 is resiliently movable between a first position for engaging the IC 1 and retaining the same within the IC receiving portion 9, and a second position where the IC 1 is released.

The wiring sheet 2 is superimposed on the base plate 4 on which the IC 1 is retained, so that the wiring sheet 2 will be in a predetermined corresponding relation with the IC 1. Thereafter, the cover plate 5 is superimposed on the wiring sheet 2, and the connecting pins 6 are inserted all the way through the through-holes 7 and press-fitted into the press-fit holes 8, so that the base plate 4, cover plate 5 and wiring sheet 2 are sandwiched and held between the base plate 4 and the cover plate 5, thereby maintaining the predetermined corresponding relation of the wiring sheet 2 with the IC 1.

The diameter of each of the connecting pins 6 provided on the cover plate 5 is designed to be smaller than the diameter of each of the through-holes 7 formed in the wiring sheet 2, so that when the connecting pins 6 are press-fitted into the connecting holes 8 through the through-holes 7, the wiring sheet 2 will not slip laterally due to the pins 6 contacting the inner walls of the through holes 7.

After the IC 1 is retained by the holder 10 of the base plate 4, the wiring sheet 2 is superimposed on this base plate 4. By doing this, the IC 1 is placed within the IC superimposing space 12 through the window 18 of the backup frame 16. By slightly adjusting the wiring sheet 2 while measuring the location of the wiring sheet 2 with respect to the IC 1 by a CCD camera or the like, the IC contact pad 14 of the wiring sheet 2 is correctly brought into corresponding relation with the contact pieces 17 of the IC 1.

As previously mentioned, the corresponding relation of the wiring sheet 2 with respect to the IC 1 is maintained by sandwiching and retaining the wiring sheet 2 between the plates 4 and 5 together with the backup frame 16 and pressing the slip-preventive sheet 3 against the wiring sheet 2. By doing this, the above-mentioned problem can effectively be solved in which the predetermined corresponding relation of the wiring sheet 2 with respect to the IC 1 is adversely affected by a possible lateral slippage of the wiring sheet 2 caused by vibrations, shocks, or the like.

By loading the assembly of the above IC carrier on the socket, the contact pad 15 is pressed against the contact members of the socket, so that an electrical connection between the contact members of the socket and the IC contact pieces pressed against the contact pad 14 can be achieved.

Figure 2:
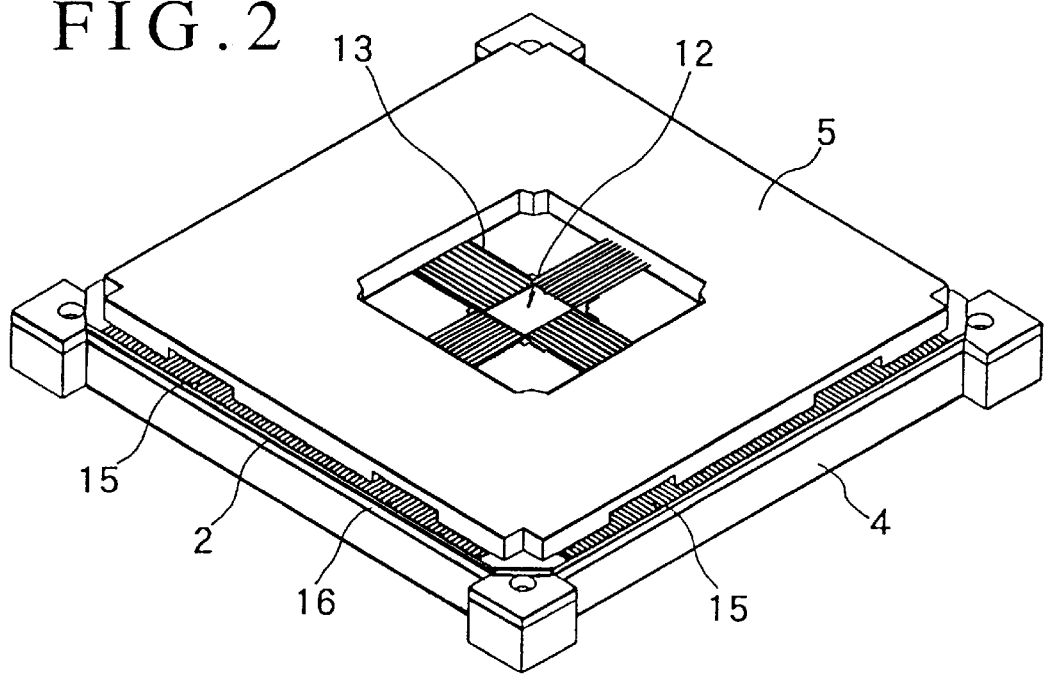
FIG. 2 is a perspective view of the carrier assembly.
Figure 3:
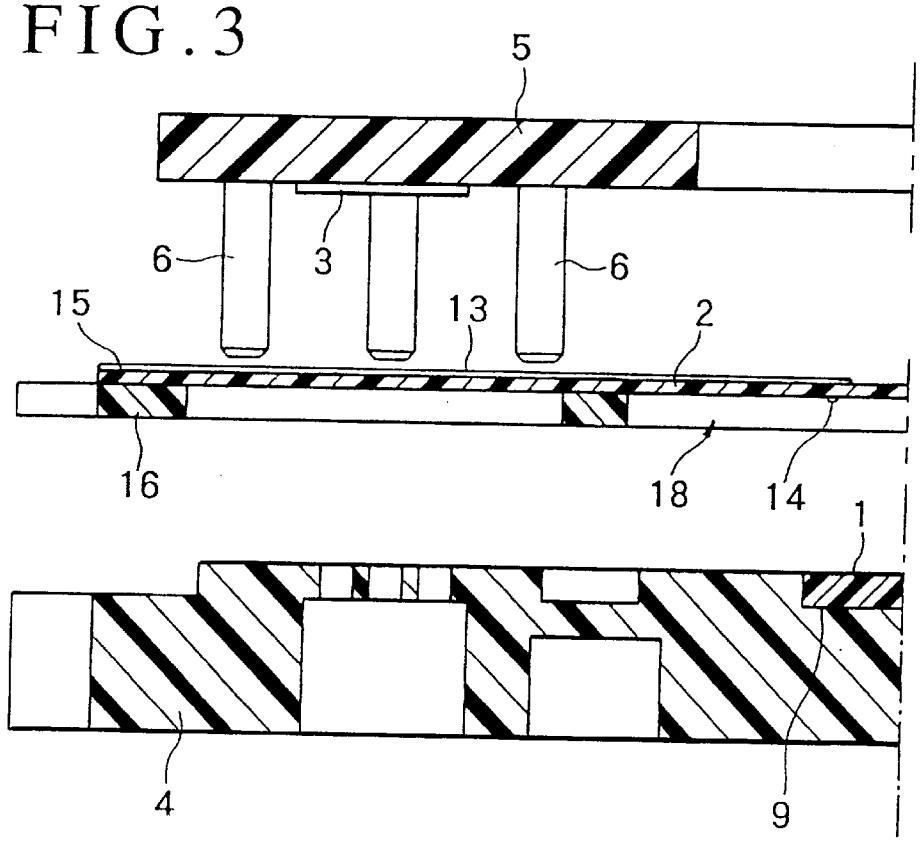
FIG. 3 is an exploded sectional view of the carrier assembly.

As typically shown in FIG. 2, the socket contact pad 15 is arranged such that the pad 15 is exposed to each side of the outer periphery of the cover plate 5 to allow for contact with the contact members of the socket. This state can be created by expanding the peripheral edge portions of the backup frame 16 from the peripheral edge portions of the cover plate 5 and arranging the socket contact pad 15 on the expanded portion.

In the above first through fourth embodiments, the slip-preventive sheet 3 is bonded to one of the base plate 4, cover plate 5 and wiring sheet 2 through an adhesive agent. In the alternative, instead of bonding the slip-preventive sheet 3 to one of the elements 4, 5 and 2, the slip-preventive sheet 3 may merely be sandwiched and held between the base plate 4 and the cover plate 5 connected together, so that a surface pressure is applied to the surface of the wiring sheet 2.

According to the assembly of the IC carrier described hereinbefore, owing to the provision of the slip-preventive sheet, the wiring sheet can effectively be prevented from slipping laterally with respect to the IC and as a result, a predetermined correct corresponding relation between the wiring sheet and the IC can be maintained. With this feature, the originally intended object of the IC carrier for contacting the IC with the socket through the wiring sheet can effectively be achieved.

The foregoing relates to a preferred embodiments of the invention. It should be understood that other variants and embodiments thereof are possible within the spirit and scope of the invention.

What is claimed is:

1. An IC carrier for retaining an IC and a wiring sheet in an opposed relation so that electrical connection is achieved between said IC and a socket through said wiring sheet, said IC carrier comprising a slip-preventive sheet capable of suppressing a lateral displacement of said wiring sheet with respect to said IC by exerting a surface pressure to said wiring sheet.

2. An IC carrier according to claim 1, wherein said IC carrier comprises a base plate and a cover plate, said IC and said wiring sheet are retained in an opposed relation between said base plate and said cover plate, and said slip-preventive sheet is integrally bonded to one of said cover plate and said base plate.

3. An IC carrier according to claim 1, wherein said IC carrier comprises a base plate and a cover plate, said slip-preventive sheet is integrally bonded to said wiring sheet, and said slip-preventive sheet is interposed between one of said cover plate or said base plate and said wiring sheet.

4. An IC carrier according to claim 1, wherein said IC carrier comprises a base plate and a cover plate, said IC is retained on said base plate, said wiring sheet is sandwiched and held between said base plate and said cover plate, and said slip-preventive sheet is interposed between one of said base plate or said cover plate and said slip-preventive sheet.

* * * * *